(12) United States Patent
Cochran et al.

(10) Patent No.: US 7,689,391 B2
(45) Date of Patent: Mar. 30, 2010

(54) DATA STRUCTURE RELATING A DEVICE CHARACTERISTIC TO A DEVICE POSITION IN A SUPPORT STRUCTURE

(75) Inventors: Charles W. Cochran, Houston, TX (US); Geoffery A. Schunicht, Spring, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 1349 days.

(21) Appl. No.: 11/133,887

(22) Filed: May 20, 2005

(65) Prior Publication Data

US 2006/0274082 A1 Dec. 7, 2006

(51) Int. Cl.
G06G 7/48 (2006.01)
(52) U.S. Cl. .......................................... 703/6
(58) Field of Classification Search ...................... 703/6
See application file for complete search history.

(56) References Cited

U.S. PATENT DOCUMENTS

| | | | |
|---|---|---|---|
| 6,384,842 B1 * | 5/2002 | DeKoning et al. | 715/734 |
| 6,442,144 B1 * | 8/2002 | Hansen et al. | 370/255 |
| 6,532,491 B1 * | 3/2003 | Lakis et al. | 709/223 |
| 7,290,182 B2 * | 10/2007 | Windl | 714/57 |
| 7,313,503 B2 * | 12/2007 | Nakagawa et al. | 703/1 |
| 7,472,043 B1 * | 12/2008 | Low et al. | 703/1 |

OTHER PUBLICATIONS

Zhu et al.: Optimal Resource Assignment in Internet Data Centers; pp. 61-69; 2001, IEEE.*

* cited by examiner

Primary Examiner—Hugh Jones

(57) ABSTRACT

A method that comprises generating a first data structure relating a physical interface to a corresponding position in a support structure, generating a second data structure relating the physical interface to an address of a device in the support structure and, using the first and second data structures, generating a third data structure relating a physical characteristic of the device to the position of the device in the support structure.

25 Claims, 6 Drawing Sheets

| PHYSICAL LOCATION NUMBER | CHARACTERISTIC DATA |
|---|---|
| 1 | 2U, BLACK, SERVER, 26.8"x19"x3.4" |
| 2 | HP SERVER rx1600-2, 26.8"x19"x1.7" STATUS-OK |
| 3 | HP SERVER 2600-2, BLACK, STATUS-ERROR |
| 4 | HP rx4640-8 |
| 5 | HP SERVER rx1600-2, 26.8"x19"x1.7" 8lbs. |
| 6 | LK16233121x2py |
| 7 | HP POWER SOURCE, 12v, 10lbs. |
| 8 | HP, 85.3F, rx5670, 15lbs. |
| 9 | LPx3112ps |

| PHYSICAL LOCATION NUMBER | CHARACTERISTIC DATA |
|---|---|
| 1 | 2U, BLACK, SERVER, 26.8"x19"x3.4" |
| 2 | HP SERVER rx1600-2, 26.8"x19"x1.7" STATUS-OK |
| 3 | HP SERVER 2600-2, BLACK, STATUS-ERROR |
| 4 | HP rx4640-8 |
| 5 | HP SERVER rx1600-2, 26.8"x19"x1.7" 8lbs. |
| 6 | LK16233121x2py |
| 7 | HP POWER SOURCE, 12v, 10lbs. |
| 8 | HP, 85.3F, rx5670, 15lbs. |
| 9 | LPx3112ps |

*FIG.3c*

| SWITCH PORT | PHYSICAL LOCATION NUMBER |
|---|---|
| 206a | 1 |
| 206b | 2 |
| 206c | 3 |
| 206d | 4 |
| 206e | 5 |
| 206f | 6 |
| 206g | 7 |
| 206h | 8 |
| 206i | 9 |

*FIG.3b*

| DEVICE IDENTIFIER | DATA |
|---|---|
| LPx3112ps | 17"x24"x43.5" SERVER<br>15lbs.<br>BLACK<br>⊞ IMAGE.GIF |
| 1xL2-A | 16"x20"x14" SERVER<br>WHITE<br>⊞ IMAGE.JPEG |
| BCCXK23 | 15"x25"x19.6" SERVER<br>STATUS-OK<br>BLACK<br>⊞ IMAGE.BMP |
| 11AAXV | 18.5"x25"x41" SERVER<br>BLACK<br>⊞ IMAGE.GIF |
| 3YCMNB-2 | POWER SOURCE 12V<br>20"x50"x60"<br>15lbs. BLACK<br>⊞ IMAGE.TIF |

FIG.3d

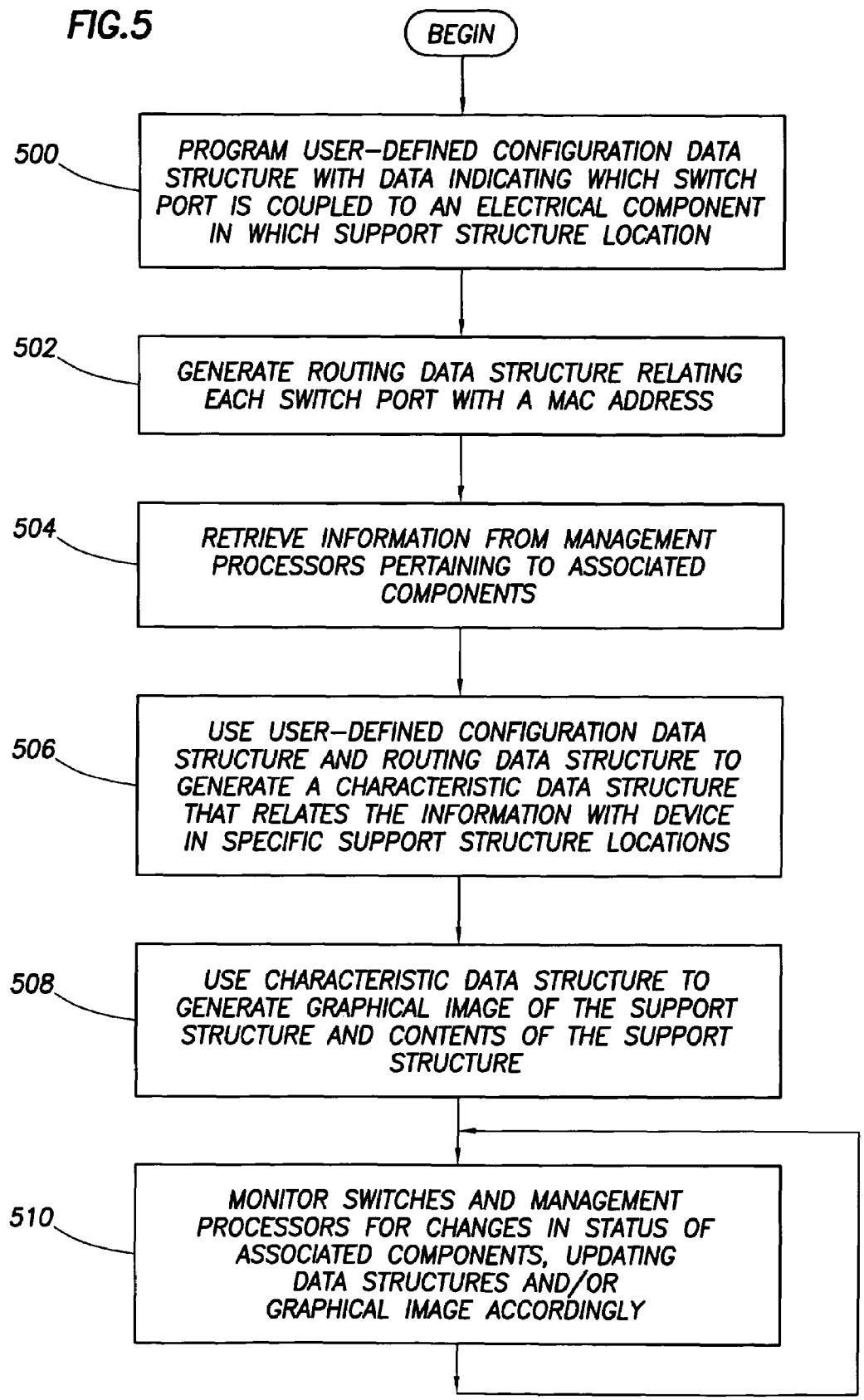

DATA STRUCTURE RELATING A DEVICE CHARACTERISTIC TO A DEVICE POSITION IN A SUPPORT STRUCTURE

BACKGROUND

Electronic systems may comprise multiple electronic components coupled together. One type of electronic system is a computer system. For ease in explanation, much of the following disclosure pertains to computer systems. However, this disclosure, including the claims, should not be construed as limited to computer systems unless otherwise stated. The disclosure pertains broadly to numerous types of electronic systems.

A computer system may comprise a plurality of individual computers and computer-related components (e.g., storage devices and network switches) coupled together. Some computer systems may be implemented in the form of a support structure, such as a rack, to which various computers and related components mount or otherwise couple. Of course, the number, type and location of components in the support structure may vary depending on the computing needs of the person or organization that operates the system. A support structure containing dozens of computers, power supplies, and other such electronic equipment is not uncommon.

In some systems, a user can access the system via a remote console located apart from the support structure. In this context, the user may not be able to actually see the support structure and the equipment contained therein.

BRIEF DESCRIPTION OF THE DRAWINGS

For a detailed description of exemplary embodiments of the invention, reference will now be made to the accompanying drawings in which:

FIG. 3a shows a routing data structure that associates each support structure switch port with a corresponding media access control (MAC) address, in accordance with embodiments of the invention;

FIG. 3b shows a user-defined configuration data structure that associates each support structure switch port with the location of a corresponding support structure component, in accordance with embodiments of the invention;

FIG. 3c shows a characteristic data structure that associates each support structure position with characteristics of a device that occupies the position, in accordance with embodiments of the invention;

FIG. 3d shows a data structure that associates device identifiers with characteristic data, in accordance with embodiments of the invention;

FIG. 5 shows a flow diagram that may be used to implement the system of FIGS. 1-4, in accordance with embodiments of the invention.

NOTATION AND NOMENCLATURE

Figure 1:
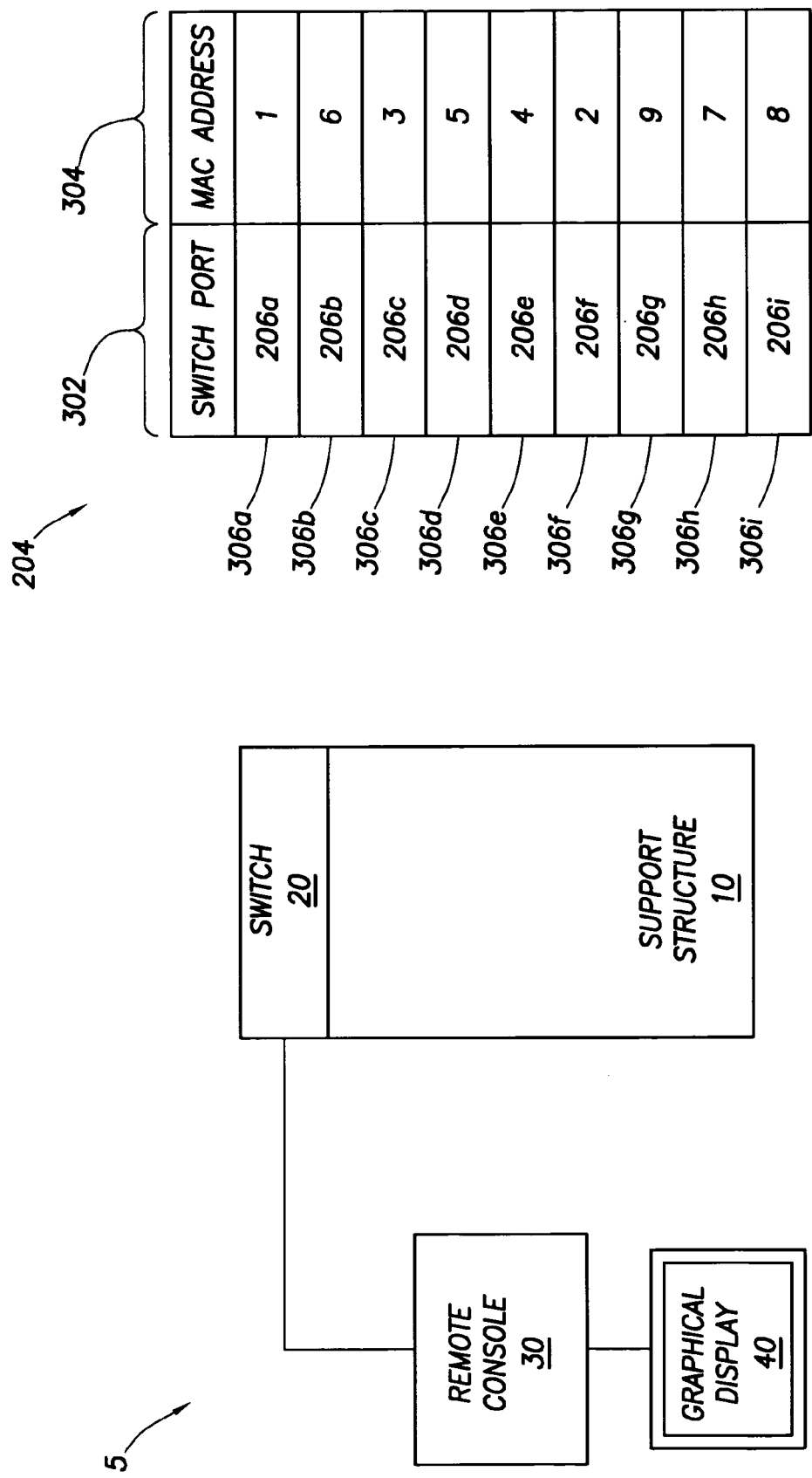
FIG. 1 shows a block diagram of a support structure, a support structure switch, a remote computer and a graphical display coupled to each other, in accordance with embodiments of the invention.

Certain terms are used throughout the following description and claims to refer to particular system components. As one skilled in the art will appreciate, companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct electrical connection. Thus, if a first device couples to a second device, that connection may be through a direct electrical connection, or through an indirect electrical connection via other devices and connections.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

The subject matter described herein is made possible at least in part by the realization that a user of a remote console may desire to know the physical configuration of a corresponding support structure, specifically, which components are contained in the support structure, where those components reside within the support structure, whether the support structure has any capacity to accept additional components and information specifically pertaining to each component. For example, a user may know that a support structure comprises a particular device, but the user may desire to know the specific location of the device in the support structure, such as to aid a technician in locating the device for maintenance activity.

Accordingly, the embodiments of the invention provide a mechanism by which information may be collected from a plurality of electrical components contained in, or otherwise coupled to, a support structure. The information is aggregated to associate each position in the support structure with the characteristics of a device that occupies that position. This information then may be used to generate, on a remote console (i.e., a remote computer), a graphical image of the support structure and the layout of the electrical components contained therein. In some embodiments, the electrical components collectively may comprise a computer system and, as such, may include computers (e.g., server computers), as well as power supplies (e.g., uninterruptible power supplies), power distribution units, manageable racks, enclosures, switches (e.g., keyboard/video/mouse switches), ports, storage devices and other computer-related components. The graphical image may be interactive, whereby an end-user of the remote console may use an input device (e.g., keyboard, mouse) to manipulate or otherwise interact with the remote console to view and display the graphical image. In at least some embodiments, the graphical image may be automatically updated at intervals predetermined by any suitable entity (e.g., the end-user), or when decided by the user. The graphical image also may be indicative of any aspect of the support structure (e.g., a rack) and the contents therein. For example, the graphical image may indicate performance data and/or technical problems such as mechanical and/or electrical failures.

Referring now to FIG. 1, a system 5 is shown comprising a support structure 10, a switch 20, a remote console 30 and a graphical display 40. In at least some embodiments, the support structure 10 may comprise a rack in which the components are mounted. Further, one or more enclosures are mountable in the support structure 10. Each enclosure may accommodate one or more electrical components. In general, the support structure 10 may be any type of structure into which electrical components and their enclosures (not shown in FIG. 1) may be mounted or otherwise coupled, although the electrical components also may be mounted into the support structure 10 without the use of enclosures. The support structure 10 may be floor mounted or be portable. The switch 20 may be coupled to the support structure 10 or, in some embodiments, contained within the support structure 10. The switch 20 may be operatively coupled to the remote console 30, which in turn may be coupled to the graphical display 40. The remote console 30 may be any suitable computer system that is located separate from or coupled to the support structure 10 and the switch 20. However, the term "remote" should not be construed as implying any specific distance between the remote console 30 and the support structure 10 or the switch 20.

As described in further detail below, the switch 20 and the remote console 30 may gather information from any or all of the electrical components in the support structure 10. Such information may comprise, for example, the types of electrical components in the support structure 10, the physical arrangement of the components in the support structure 10, the make and model of each of the electrical components, physical characteristics of the components and any other suitable information that may be pertinent to the support structure 10 or the components contained therein. The remote console 30 then may aggregate the collected information to determine the characteristics of each component in the support structure 10 and the positions of the components in the support structure 10. This aggregated information may be stored into a persistent storage and may be used to generate a graphical image of the support structure 10 and the components contained therein. The graphical image of the support structure 10 then is shown on display 40.

Figure 2:
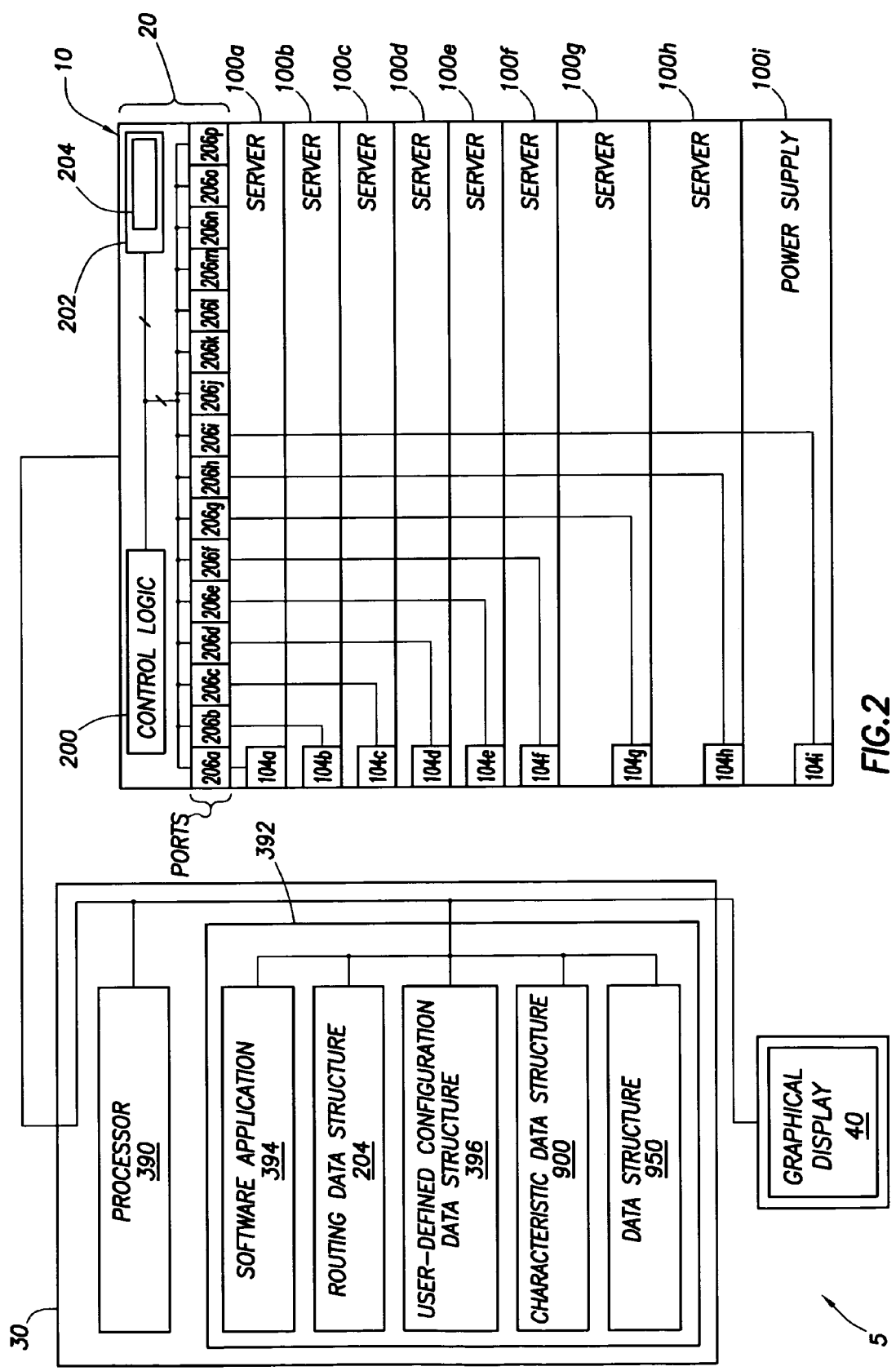
FIG. 2 shows a detailed version of the block diagram of FIG. 1, in accordance with embodiments of the invention.

FIG. 2 shows an exemplary embodiment of the system 5 of FIG. 1 in detail. In FIG. 2, the support structure 10 comprises a plurality of electrical components 100, such as servers 100a-100h and a power supply 100i. As mentioned above, each of the electrical components 100 may, in some embodiments, be contained within an enclosure (not specifically shown in FIG. 2) or may be inserted into the support structure 10 without an enclosure. Each of the electrical components 100a-100i may comprise a corresponding management processor 104a-104i. A management processor 104 may be integrated onto the motherboard of an associated component 100. A management processor 104 also may be a baseboard management controller or a separate management card. A management processor 104 may share a physical network interface or media access control (MAC) address of an associated component 100. Alternatively, a management processor 104 may have its own physical network interface and MAC address. A management processor 104 may control some or all aspects of an associated electrical component 100. The management processor 104 also comprises information pertaining to the associated electrical component 100, such as the physical characteristics of the component 100. An exemplary list of physical characteristics comprises physical dimensions, color, weight, power consumption, thermal characteristics, model type and component type. The scope of disclosure is not limited to this list. For example, the list also may comprise information such as the manufacturer, model number and/or serial number of the component 100. Each management processor 104 may be assigned a MAC address, where the MAC address of each management processor 104 is different from the MAC address of any other management processor 104.

The switch 20 may comprise, among other things, a control logic 200 that controls some or all aspects of the switch 20, a memory 202 comprising a routing data structure 204, and multiple ports 206a-206p. As described in further detail below, each of the management processors 104 may be coupled to one of the ports 206 in any suitable order. In the embodiment shown in the figure, ports 206a-206i are coupled to management processors 104a-104i, respectively. Generally, there is one switch port for each location in which an electrical component 100 may be installed in the support structure 10.

The MAC address of each of the electrical components 100 may be sent from the management processors 104 of the components 100 to the control logic 200 of the switch 20 via the ports 206. The MAC address may be sent, for example, in response to a signal from the switch 20 requesting such information. The signal from switch 20 may be sent at any suitable time, such as during a boot-up process. In turn, the control logic 200 uses these MAC addresses to automatically generate a routing data structure 204, an exemplary embodiment of which is shown in FIG. 3a. Referring to FIGS. 2 and 3a, the routing data structure 204 may comprise a plurality of entries 306a-306i. Each entry contains a switch port value 302 and a MAC address 304. Each entry 306 in the data structure 204 associates a particular switch port 206 with the MAC address of the management processor 104 (i.e., the electrical component 100) to which that port is coupled. In some embodiments, switch port value 302 may contain an actual value indicative of a switch port. In other embodiments, the switch port value 302 is implied, that is, it is understood that the first entry 306a corresponds to a first switch port.

For example, referring to FIG. 2, switch port 206a is shown coupled to the management processor 104a of server 100a. Assume that management processor 104a has a MAC address of "1." Accordingly, in FIG. 3a, entry 306a shows that switch port 206a is associated with a MAC address of "1." Similarly, referring again to FIG. 2, switch port 206b is shown coupled to the management processor of server 100b, which, for the present discussion, is assumed to have a MAC address of "6." Accordingly, referring again to FIG. 3a, entry 306b shows that switch port 206b is associated with a MAC address of "6." The remaining entries of routing data structure 204 may be filled in a similar fashion. Once determined by the control logic 200, the routing data structure 204 is stored in the memory 202 of the switch 20. A copy of the routing data structure 204 also may be transferred to the remote console 30, for use in generating the aforementioned graphical image. In at least some embodiments, the control logic 200 may periodically monitor the configuration of the ports 206 and the management processors 104. If the configuration is altered, the control logic may automatically update the routing data structure 204 accordingly.

Referring again to FIG. 2, the remote console 30 may comprise, among other things, a processor 390 coupled to a memory 392. As shown, the memory 392 comprises a software application 394, a copy of the routing data structure 204 provided by the switch 20, and a user-defined configuration data structure 396, a characteristic data structure 900 and a data structure 950, described further below. An illustrative user-defined configuration data structure 396 is shown in FIG. 3b. Each entry 350a-350i of the data structure 396 comprises a switch port value 352 and a physical location number 354. Each entry 350a-350i of the user-defined configuration data structure 396 associates a switch port 206a-206i with a "physical location number" of the component 100 to which that port is coupled. Each physical location number is indicative of the physical location of a particular component 100 in the support structure 10 and may be assigned as desired. Still referring to FIG. 2, because server 100a is the topmost server (assuming the support structure 10 is oriented in a vertical fashion such that the server 100a is located at the top and the power supply 100i is located at the bottom), in one illustrative embodiment, the server 100a may be assigned a physical location number of "1." Similarly, the server 100b may be assigned a physical location number of "2," the server 100c may be assigned a physical location number of "3," and the remaining electrical components 100 and the power supply 100i may be assigned physical location numbers in a similar fashion. In at least some embodiments, if the switch port values 352 are not expressly provided in the data structure 396, and/or if the physical location numbers 354 are not expressly provided in the data structure 396, the switch port values 352 and/or the physical location numbers 354 may be implied, meaning it may be assumed that the first switch port (i.e., switch port 206a) corresponds with the first physical location (i.e., physical location number 1), the second switch port (i.e., switch port 206b) corresponds with the second physical location (i.e., physical location number 2), and the remaining switch ports correspond with the remaining physical locations in a similar fashion.

Although the components 100 are shown as being inserted horizontally into the support structure 10, the components 100 may be arranged in the support structure 10 in any suitable fashion. For example, the components 100 may be blade servers that are installed vertically into the support structure 10, such that the space occupied by server 100a in FIG. 2 would instead be occupied by a plurality of vertically arranged blade servers. Further, in some embodiments, the order in which the components 100 are arranged may be different than the order shown in FIG. 2. For example, instead of being located in the topmost position in the support structure 10, the server 100a instead may be located in the bottommost position in the structure 10 (i.e., the position occupied by the power supply 100i in FIG. 2). The scope of disclosure is not limited to any particular arrangement of components 100 within the support structure 10.

Because each port 206a-206i is coupled to a component 100a-100i, each port 206 is associated with the physical location number of the corresponding component 100. Accordingly, referring to FIG. 3b, entry 350a shows that port 206a is associated with physical location number "1," since port 206a is coupled to the server 100a, which is the topmost server in the support structure 10. Similarly, entry 350b shows that port 206b is associated with physical location number "2," since port 206b is coupled to the second topmost server in the support structure 10 (i.e., server 100b). The remaining entries in the data structure 396 may be filled in a similar fashion.

The user-defined configuration data structure 396 in the remote console 30 may be generated in any suitable manner. For example, in at least some embodiments, after the electrical components 100 are physically installed into the support structure 10, a user of the remote console 30 may program the data structure 396 to reflect the physical arrangement of the components 100 in the support structure 10. In other embodiments, the data structure 396 may be preprogrammed, e.g., by a manufacturer, and the components 100 are installed into the support structure 10 based on the physical arrangement indicated by the preprogrammed data structure 396 (i.e., according to a "best practices method"). In at least some embodiments, if the configuration of ports 206 and of the physical locations in the support structure 10 is altered, the data structure 396 may be manually updated by, for example, an end-user.

Referring to FIG. 2, after the routing data structure 204 and the configuration data structure 396 have been generated, the processor 390 may send a signal to the control logic 200, causing a copy of the routing data structure 204 to be transferred from the memory 202 to the memory 392 in the remote console 30. The processor 390 of the remote console 30 then executes a software application 394 that causes the processor 390 to generate a graphical image of the support structure 10 and the contents of the support structure 10. In order to generate such a graphical image, data pertaining to each of the electrical components 100 is obtained from the management processors 104. For example, the remote console 30 may send a signal to at least some of the management processors 104a-104i requesting data from each management processor 104, the data from each management processor 104 indicative of the characteristics of a corresponding component 100. Such data may comprise physical dimensions, weight, thermal characteristics, and any other pertinent characteristics.

Because each management processor 104 comprises a MAC address, the processor 390 of the remote console 30 is able to use its copy of the data structure 204 to associate data received from a MAC address to a corresponding switch port 206. For example, the processor 390 may determine that any data characteristic of a device in the support structure 10 (e.g., physical dimensions, weight) received from MAC address "4" corresponds to switch port 206e. The processor 390 then may use data structure 396 to determine the physical location of the component 100 to which the data pertains. Continuing with the above example, the processor 390 may use data structure 396 to determine that switch port 206e corresponds with the component 100 that is positioned in the support structure 10 according to a physical location number "5." Thus, the processor 390 determines that the data received from MAC address "4" may be ascribed to the component 100 that is positioned in the support structure 10 according to location number "5."

As shown in FIG. 3c, such determinations may be used to generate a characteristic data structure 900 that relates characteristic data received from devices in the support structure 10 (e.g., component type, manufacturer, model number, physical dimensions, color, weight, power consumption, thermal characteristics, model type, serial number, and any other such information) to the corresponding physical locations of the devices in the support structure 10. Continuing with the previous example, an entry 902 in the data structure 900 may comprise a field 904 indicative of the location of the component 100 in the support structure 10 (i.e., location number "5"), and a corresponding field 906 in the data structure 900 may contain characteristic data received from the device in location number "5." As shown, field 906 indicates that the device in location number "5" is a server developed by the HEWLETT PACKARD COMPANY®, has a model number rx-1620-2, has dimensions 26.8"×19"×1.7", and weighs 8 lbs. Although the information in field 906 is shown in text format, the data structure 900 and contents thereof may be stored in any suitable, machine-readable format. The data structure 900 is stored in the memory 392. Because the configuration of data structure 900 is dependent on the configuration of data structures 204, 396, any updates to the data structures 204, 396 also are reflected in the data structure 900.

Using the data structure 900, the processor 390 generates a graphical image of the support structure 10 and one or more of the devices contained therein, such as the HEWLETT PACK-ARD COMPANY® rx-1620-2 server. More specifically, the processor 390 executes the software application 394, which causes the processor 390 to use the characteristic data in the characteristic data structure 900 to generate the graphical image. For example, referring to FIG. 3c, the software application 394 causes the processor 390 to obtain characteristic data from the field 906 that corresponds to physical location number 1. The characteristic data in field 906 describes the device in physical location number 1 as a black, 2U server having dimensions 26.8"×19"×3.4".

In at least some embodiments, the software application 394 comprises a plurality of subroutines for generating and/or modifying graphical images. Each subroutine is dedicated to generating a graphical image or modifying a graphical image based on a different type of characteristic data. For instance, because the device in physical location number 1 above is a 2U server, a subroutine specifically designed to generate a graphical image of a basic 2U server may be executed. Similarly, because the device is black, a subroutine specifically designed to color an existing graphical image black may be executed. Further, because the device has dimensions 26.8"×19"×3.4", a subroutine specifically designed to modify the size of an existing graphical image may be executed. By executing these subroutines, a graphical image of a black, 2U server having dimensions proportional to 26.8"×19"×3.4" is generated. A greater amount of characteristic data in a field 906 may result in a more detailed graphical image.

In some embodiments, characteristic data provided in fields 906 of the data structure 900 may be limited. For example, the only data provided in the field 906 for a particular device may be a model number. In such embodiments, as shown in FIG. 3d, the memory 392 may comprise an updateable data structure 950 that relates a specific device identifier (e.g., model numbers, serial numbers) with characteristic data that may be used to generate a graphical image of the device. Thus, for example, because only a model number LPx3112ps is provided in the field 906 of entry 908, the processor 390 may locate the model number LPx3112ps in the data structure 950 and discover that the device having model number LPx3112ps is a black server having dimensions of 17"×24"× 43.5" and weighing 15 lbs., as shown in entry 956 of data structure 950. The processor 390 then may use this information to generate a graphical image of the server having model number LPx3112ps.

In some embodiments, the data structure 950 may correlate a device identifier (e.g., model number, serial number) with an electronic image (e.g., in graphics interchange format (GIF), basic multilingual plane format (BMP)) of the device. The processor 390 may use the electronic image to generate at least part of the graphical image mentioned above. Electronic images may be preprogrammed into the data structure 950 by a manufacturer or an end-user. The electronic images and other information in the data structure 950 may be manually updated by an end-user as desired.

Figure 4:
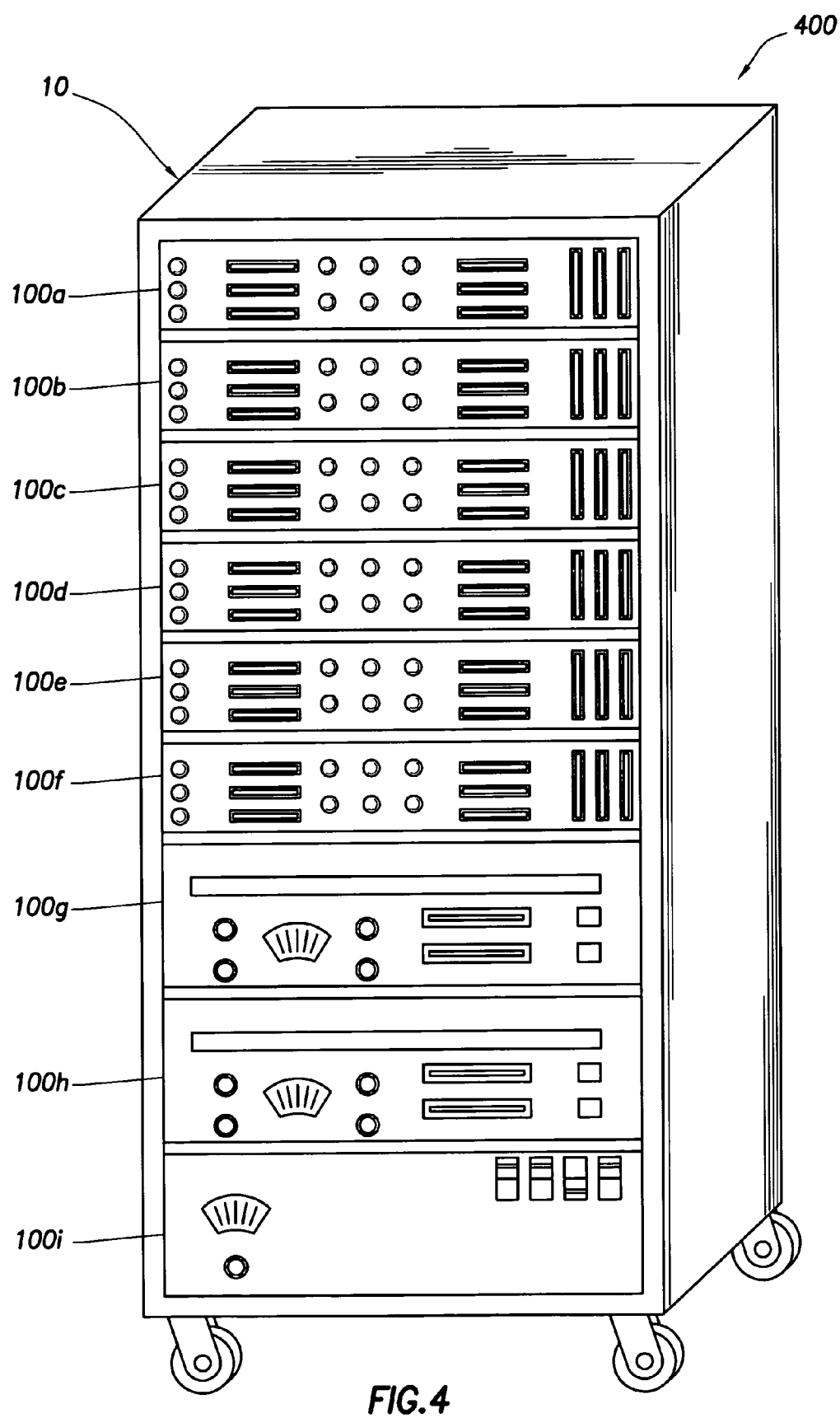
FIG. 4 shows an illustrative graphical image that may be displayed on the graphical display of FIGS. 1 and 2, in accordance with embodiments of the invention.

The processor 390 arranges the devices in the graphical image based on the position information provided in the data structure 900. For instance, since field 904 in the data structure 900 indicates that the rx-1620-2 server is positioned in location number "5" of the support structure 10, the graphical image shows the rx-1620-2 server located in position number "5" of the support structure 10. An illustrative image 400 for system 5 is shown in FIG. 4. The image 400 shows the support structure 10, the servers 100a-100h, and the power supply 100i. The aforementioned graphical images, including image 400, may be displayed on a display 40 (as shown in FIGS. 1 and 2) or may be generated (e.g., printed) on paper.

FIG. 5 shows a flow diagram of an illustrative method that may be used to generate the graphical image 400. The method may begin by programming the user-defined configuration data structure 396 with information indicating which switch port 206 is connected to an electrical component 100 in which physical location in the support structure 10 (block 500). As previously described, the data structure 396 may be programmed by a manufacturer or by a user after installing the electrical components 100 in the support structure 10. The method continues by generating a routing data structure 204 relating each switch port to a MAC address (block 502). In some embodiments, the routing data stricture 204 is generated prior to the user-defined configuration data structure 396. The method continues further by retrieving from management processors 104 information pertaining to associated components 100 (block 504). As previously indicated, such information comprises physical, thermal, electrical and any other suitable characteristics of the components 100 associated with the management processors 104. The method continues by using the user-defined configuration data structure 396 and the routing data structure 204 to generate a characteristic data structure 900 that relates the aforementioned information with components 100 in specific support structure locations (block 506), as previously explained. The method then may continue by using the characteristic data structure to generate a graphical image 400 of the support structure 10 and contents thereof (block 508). Finally, the method comprises monitoring switches (e.g., switch 20) and management processors 104 for changes in the status of associated components 100, such as the insertion of additional hardware into a component 100, the replacement of a component 100, the malfunction of a component 100, etc. One or more of the data structures and/or the graphical image 400 is updated accordingly (block 510).

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A method, comprising:
    generating a first data structure relating a physical interface of a device to a corresponding position in a support structure;
    generating a second data structure relating the physical interface to an address of a device in the support structure;
    using the first and second data structures, generating a third data structure relating a physical characteristic of the device to the position of the device in the support structure; and
    generating and presenting to a user a graphical image of the device and the support structure using the third data structure.

2. The method of claim 1, wherein generating the graphical image of the device and the support structure using the third data structure comprises associating the address of the device with the position of the device in the support structure and with the physical interface.

3. The method of claim 1 wherein presenting the graphical image comprises displaying the graphical image on a display.

4. The method of claim 1, wherein presenting the graphical image comprises printing the graphical image on paper.

5. The method of claim 1 further comprising updating the graphical image at predetermined intervals.

6. The method of claim 1, wherein generating the first data structure relating the physical interface to the corresponding position in the support structure comprises using a physical interface selected from the group consisting of a switch and a switch port.

7. The method of claim 1, wherein generating the second data structure relating the physical interface to the address of the device comprises using a device selected from the group consisting of a server, a power supply, a storage device, an uninterruptible power supply, a power distribution unit, a keyboard/video/mouse switch, a manageable rack, an enclosure and a computer.

8. The method of claim 1, wherein generating the third data structure comprises retrieving data from the device, said data indicative of at least one of physical and electrical characteristics of the device.

9. The method of claim 8, wherein retrieving data from the device comprises retrieving data selected from the group consisting of a media access control (MAC) address, a model number, a model type, a serial number, manufacturer, color, physical dimensions, weight, power consumption, and thermal properties.

10. The method of claim 9, wherein generating the third data structure comprises populating the third data structure with data selected from said group.

11. The method of claim 1 wherein generating the first data structure relating the physical interface to the corresponding position in the support structure comprises using a rack.

12. An apparatus, comprising:
a processor;
a memory coupled to the processor, said memory comprising:
  a first data structure adapted to relate a switch port to a position in a support structure;
  a second data structure adapted to relate the switch port to an address of a device; and
  a third data structure relating a physical characteristic of the device to the position of the device in the support structure; and
a display coupled to said processor;
wherein the processor uses at least one of the first, second and third data structures to generate a graphical image of at least one of the support structure and the device;
wherein the graphical image is indicative of the position of the device in the support structure.

13. The apparatus of claim 12, wherein at least one of the data structures is updated when the position of the device in the support structure is altered.

14. The apparatus of claim 12, wherein the graphical image is updated at predetermined intervals.

15. The apparatus of claim 12, wherein the processor is not located in the support structure.

16. The apparatus of claim 12, wherein the device is selected from the group consisting of a server, an enclosure, a power supply, a storage device, an uninterruptible power supply, a keyboard/video/mouse switch, a manageable rack and a computer.

17. The apparatus of claim 12, wherein the processor generates the graphical image using data associated with at least one of physical characteristics and electrical characteristics of the device.

18. The apparatus of claim 17, wherein the data is selected from the group consisting of physical dimensions, weight, color, manufacturer, model, serial number, thermal properties and power consumption.

19. The apparatus of claim 17, wherein the processor retrieves the data from the device by associating the switch port with the position in the support structure and with the address of the device.

20. The apparatus of claim 12, wherein the support structure is a rack.

21. The apparatus of claim 12 further comprising a fourth data structure adapted to relate a device identifier with at least one of physical characteristic data and an electronic image.

22. A system, comprising:
a means for generating a first data structure relating a physical interface to a corresponding position in a support structure;
a means for generating a second data structure relating the physical interface to an address of a device in the support structure; and
a means for generating a third data structure, using the first and second data structures, that relates a physical characteristic of the device to the position of the device in the support structure.

23. The system of claim 22 further comprising a means for generating a graphical image of the device and the support structure using at least one of said data structures, the graphical image indicative of the position of the device in the support structure.

24. The system of claim 23, wherein the means for generating the graphical image generates the graphical image using data in the third data structure.

25. The system of claim 22, wherein the physical characteristic is selected from the group consisting of physical dimensions, weight, power consumption, thermal properties, color, manufacturer, model number and serial number of the device.

* * * * *